(12) United States Patent
Lin et al.

(10) Patent No.: US 10,170,432 B2
(45) Date of Patent: Jan. 1, 2019

(54) SEMICONDUCTOR STRUCTURE

(71) Applicant: NANYA TECHNOLOGY CORPORATION, New Taipei (TW)

(72) Inventors: Po-Chun Lin, Changhua County (TW); Chin-Lung Chu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 15/493,119

(22) Filed: Apr. 20, 2017

(65) Prior Publication Data

US 2018/0308803 A1 Oct. 25, 2018

(51) Int. Cl.
*H01L 23/552* (2006.01)
*H01L 23/522* (2006.01)
*H01L 23/532* (2006.01)
*H01L 23/00* (2006.01)
*H01L 23/528* (2006.01)

(52) U.S. Cl.
CPC ........ *H01L 23/552* (2013.01); *H01L 23/5226* (2013.01); *H01L 23/5283* (2013.01); *H01L 23/53238* (2013.01); *H01L 24/09* (2013.01); *H01L 2224/02381* (2013.01)

(58) Field of Classification Search
CPC .............. H01L 23/552; H01L 23/5226; H01L 23/5283; H01L 23/53238; H01L 24/09
See application file for complete search history.

(56) References Cited

U.S. PATENT DOCUMENTS

| 7,851,893 B2 | 12/2010 | Kim et al. |
| 8,796,140 B1 | 8/2014 | Gu et al. |
| 2009/0134500 A1* | 5/2009 | Kuo ............... H01L 23/481 257/659 |
| 2009/0289324 A1* | 11/2009 | Goodlin ............ H01L 21/308 257/506 |
| 2011/0139497 A1 | 6/2011 | Li et al. |
| 2011/0241185 A1 | 10/2011 | Koester et al. |
| 2014/0339698 A1* | 11/2014 | Cassidy ........... H01L 21/76898 257/738 |

FOREIGN PATENT DOCUMENTS

| TW | 201515173 A | 4/2015 |
| TW | 201630153 A | 8/2016 |

* cited by examiner

*Primary Examiner* — Walter H Swanson
(74) *Attorney, Agent, or Firm* — CKC & Partners Co., Ltd.

(57) ABSTRACT

A semiconductor structure is provided. The semiconductor structure includes a substrate, at least one semiconductor device, a through-substrate via (TSV), and a shield structure. The substrate has a front side surface and a back side surface. The semiconductor device is disposed on the front side surface. The TSV is disposed in the substrate. The TSV is exposed by the front side surface and the back side surface, and the TSV is electrically connected to the semiconductor device. The shield structure is disposed in the substrate and surrounds the TSV. The shield structure is exposed by the front side surface, the shield structure is electrically isolated from the TSV, and the shield structure is used to be electrically connected to a power terminal or a ground terminal.

15 Claims, 9 Drawing Sheets

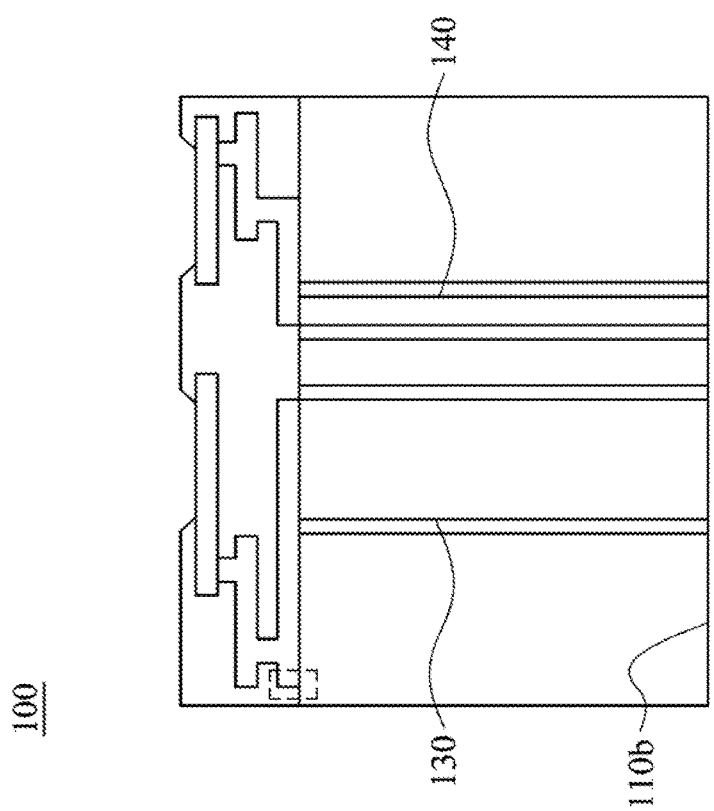
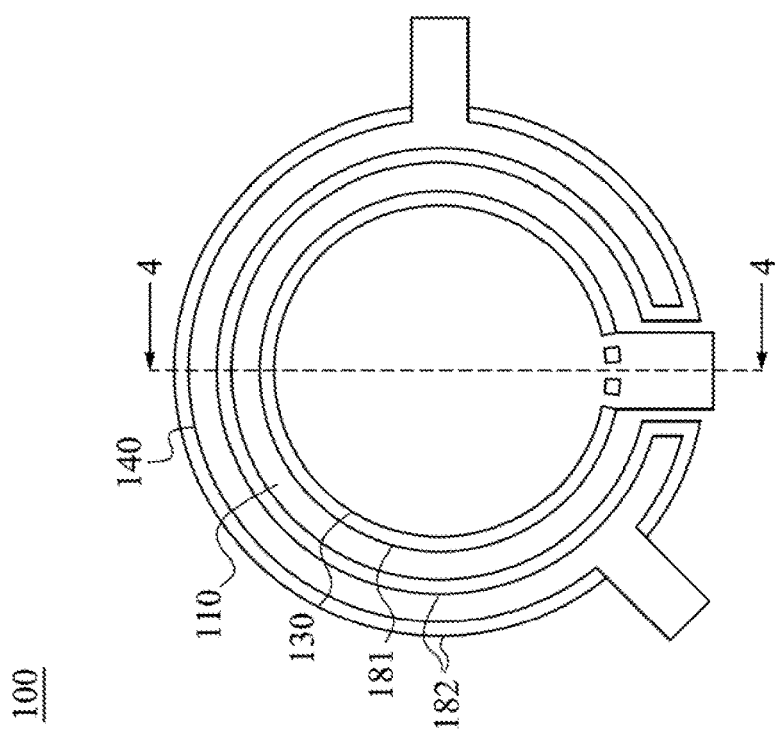
Fig. 5
Fig. 6

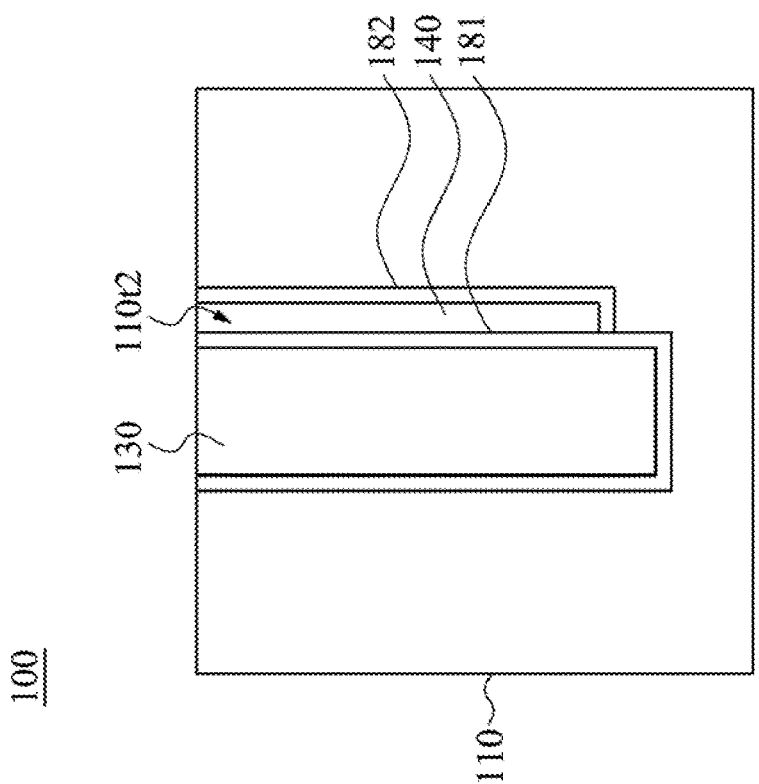
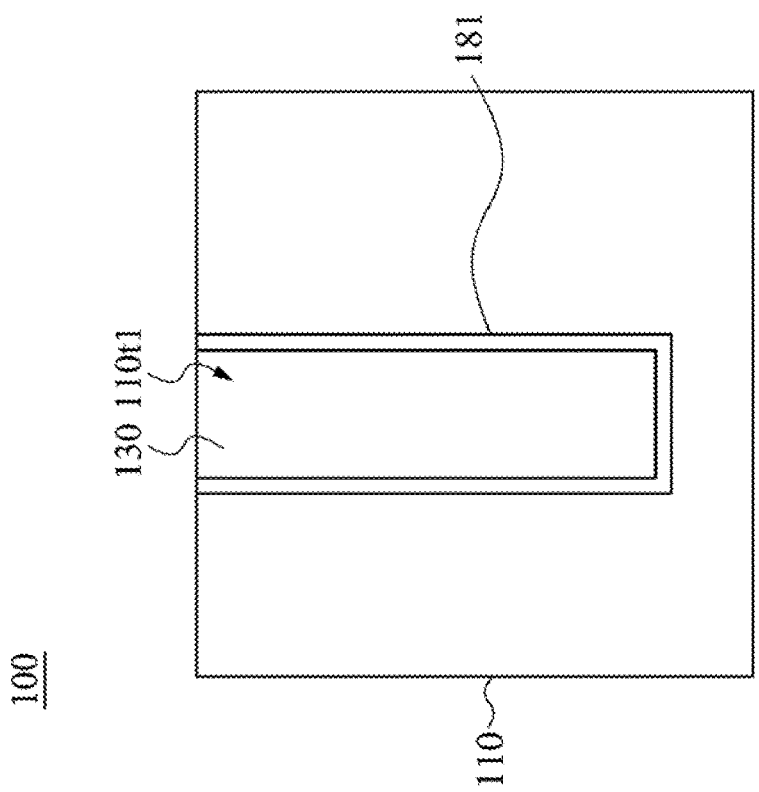

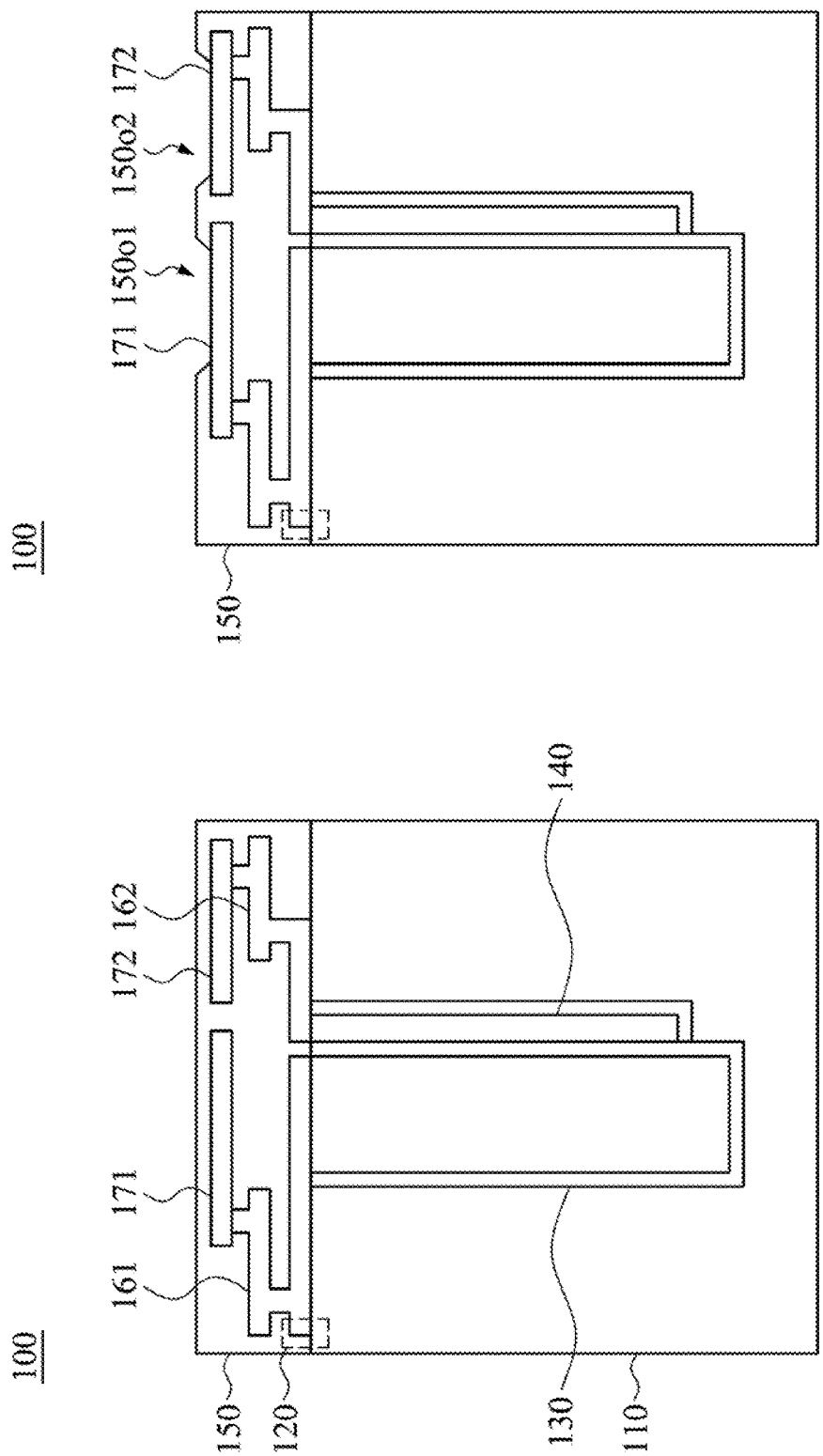

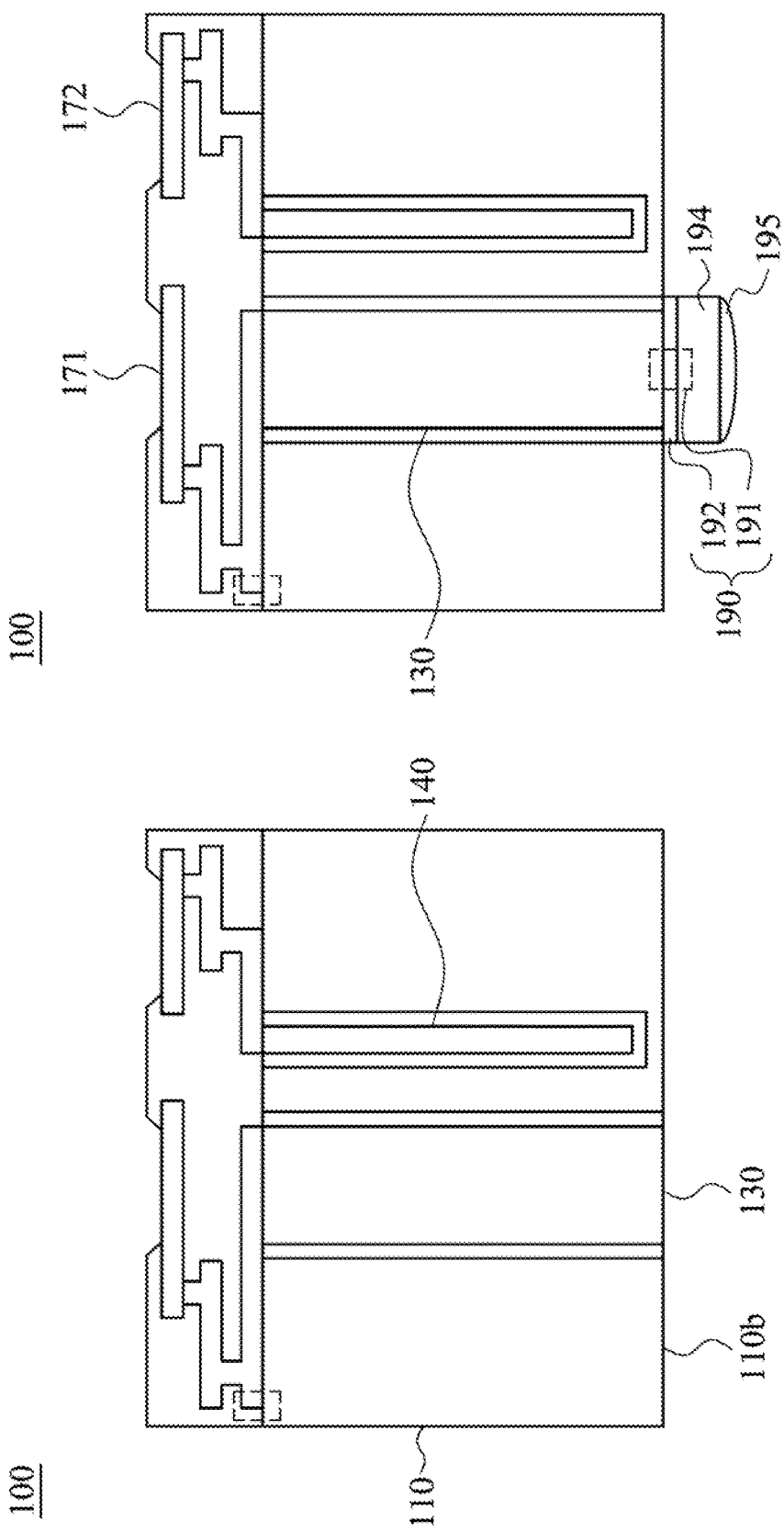

SEMICONDUCTOR STRUCTURE

BACKGROUND

Technical Field

The present disclosure relates to a semiconductor structure.

Description of Related Art

With the rapid growth of electronic industry, the R & D of electronic products is gradually directed to the pursuit of versatile and high performance. In order to achieve the requirements of high integration and miniaturization of semiconductor components, the requirements of the package structure also increase.

To further improve various characteristics of a package structure, persons in the industry all endeavor to search the solutions. How to provide a package structure with better characteristics is one of the important research topics, and is also a target that needs to be improved in the related fields.

SUMMARY

This disclosure provides a semiconductor structure to prevent crosstalk between the currents in the TSVs.

In one aspect of the disclosure, a semiconductor structure is provided. The semiconductor structure includes a substrate, at least one semiconductor device, a through-substrate via (TSV), and a shield structure. The substrate has a front side surface and a back side surface. The semiconductor device is disposed on the front side surface. The TSV is disposed in the substrate. The TSV is exposed by the front side surface and the back side surface, and the TSV is electrically connected to the semiconductor device. The shield structure is disposed in the substrate and surrounds the TSV. The shield structure is exposed by the front side surface, and the shield structure is electrically isolated from the TSV. The shield structure is used to be electrically connected to a power terminal or a ground terminal.

In one or more embodiments, the semiconductor structure further includes a first dielectric layer, a first circuit layer, and a second circuit layer. The first dielectric layer is disposed on the front side surface. The first circuit layer is disposed in the first dielectric layer, and the first circuit layer is electrically connected to the TSV. The second circuit layer is disposed in the first dielectric layer, and the second circuit layer is electrically connected to the shield structure.

In one or more embodiments, the semiconductor structure further includes a first pad and a second pad. The first pad is electrically connected to the first circuit layer, and the first pad is used to be electrically connected to a signal terminal. The second pad is electrically connected to the second circuit layer, and the second pad is used to be electrically connected to the power terminal or the ground terminal.

In one or more embodiments, the first dielectric layer, the first circuit layer, the second circuit layer, and the semiconductor device form a first redistribution layer.

In one or more embodiments, a line pitch of the first circuit layer is less than 0.2 µm.

In one or more embodiments, the shield structure has a connecting portion electrically connecting the second circuit layer.

In one or more embodiments, the shield structure has a plurality of connecting portions electrically connecting the second circuit layer.

In one or more embodiments, a plurality of the TSVs are disposed in the substrate.

In one or more embodiments, the shield structure is exposed by the back side surface.

In one or more embodiments, the shield structure is covered by the back side surface.

In one or more embodiments, a height of the TSV is greater than a height of the shield structure.

In one or more embodiments, a height of the TSV approximately equals a height of the shield structure.

In one or more embodiments, the shield structure is a metal layer.

In one or more embodiments, the semiconductor structure further includes a second redistribution layer disposed on the back side surface and electrically connected to the TSV.

In one or more embodiments, the semiconductor structure further includes a bump disposed on a side of the second redistribution layer opposite to the substrate.

In one or more embodiments, the second redistribution layer includes a second dielectric layer and a third circuit layer. The third circuit layer is disposed in the second dielectric layer and electrically connected to the TSV, in which a line pitch of the third circuit layer is greater than 1 µm.

In one or more embodiments, the substrate is substantially absent between the TSV and the shield structure.

In one or more embodiments, a part of the substrate is disposed between the TSV and the shield structure.

In one or more embodiments, the TSV is made of copper.

In one or more embodiments, the TSV and the shield structure is made of the same material.

Because the distances between the TSVs are not very large, some crosstalk between the currents in the TSVs may happen. In order to prevent the crosstalk between the currents in the TSVs, the shield structure surrounds the TSV, such that the shielding effect will protect the currents in the TSVs from being influenced by the electric fields and the magnetic fields generated by other currents in the TSVs.

Further, because the shield structure will be electrically connected to a power terminal or a ground terminal, the voltage of the shield structure can maintain unchanged (in most case, the voltage will be zero). Therefore, the shield structure can effectively perform the shielding effect.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows:

FIG. 5 is a schematic top view of the semiconductor structure according to another embodiment of this disclosure;

FIG. 6 is a schematic cross-sectional view of the semiconductor structure according to another embodiment of this disclosure;

FIGS. 7 to 12 are schematic cross-sectional views of intermediate steps in processes for manufacturing the semiconductor structure according to one embodiment of this disclosure; and FIGS. 13 to 18 are schematic cross-sectional views of intermediate steps in processes for manufacturing the semiconductor structure according to another embodiment of this disclosure.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically depicted in order to simplify the drawings.

Figure 1:
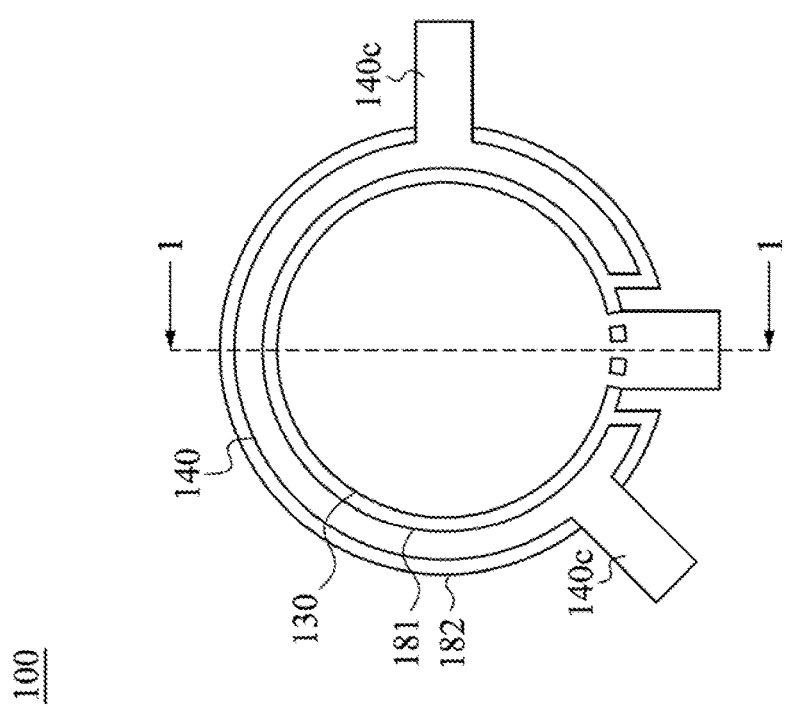
FIG. 1 is a schematic cross-sectional view of a semiconductor structure according to one embodiment of this disclosure.
Figure 2:
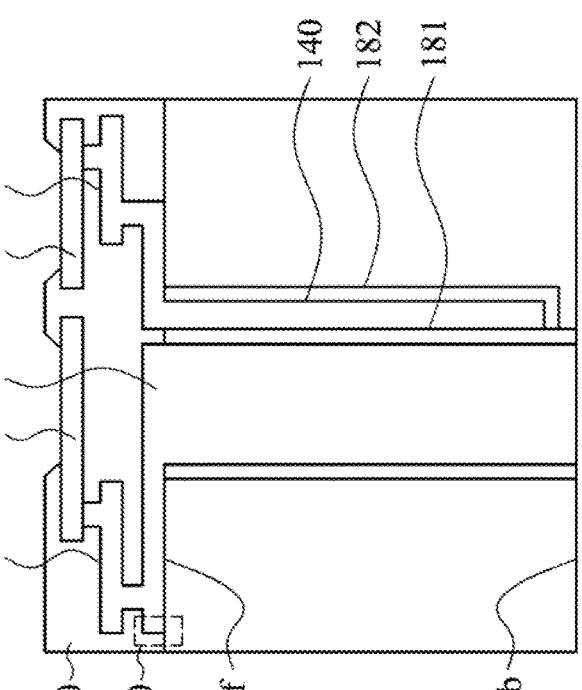
FIG. 2 is a schematic top view of the semiconductor structure according to one embodiment of this disclosure.

FIG. 1 is a schematic cross-sectional view of a semiconductor structure 100 according to one embodiment of this disclosure. FIG. 2 is a schematic top view of the semiconductor structure 100 according to one embodiment of this disclosure. FIG. 1 is the cross-sectional view viewed along line 1-1 of FIG. 2. As shown in FIG. 1 and FIG. 2, a semiconductor structure 100 is provided. In some embodiments, the semiconductor structure 100 may be applied to a dynamic random access memory device (DRAM). The semiconductor structure 100 may be manufactured in wafer-level or panel-level processes.

The semiconductor structure 100 includes a substrate 110, at least one semiconductor device 120, at least one through-substrate via (TSV) 130, and at least one shield structure 140. The substrate 110 has a front side surface 110$f$ and a back side surface 110$b$. The semiconductor device 120 is disposed on the front side surface 110$f$. The TSV 130 is disposed in the substrate 110. The TSV 130 is exposed by the front side surface 110$f$ and the back side surface 110$b$, and the TSV 130 is electrically connected to the semiconductor device 120. The shield structure 140 is disposed in the substrate 110 and surrounds the TSV 130. The shield structure 140 is exposed by the front side surface 110$f$, and the shield structure 140 is electrically isolated from the TSV 130. The shield structure 140 is used to be electrically connected to a power terminal or a ground terminal.

Specifically, a plurality of the TSVs 130 are disposed in the substrate 110. Because the distances between the TSVs 130 are not very large, some crosstalk between the currents in the TSVs 130 may happen. In order to prevent the crosstalk between the currents in the TSVs 130, the shield structure 140 surrounds the TSV 130, such that the shielding effect will protect the currents in the TSVs 130 from being influenced by the electric fields and the magnetic fields generated by other currents in the TSVs 130.

Further, because the shield structure 140 will be electrically connected to a power terminal or a ground terminal, the voltage of the shield structure 140 can maintain unchanged (in most case, the voltage will be zero). Therefore, the shield structure 140 can effectively perform the shielding effect.

The substrate 110 may be composed of a single crystalline semiconductor material or a polycrystalline semiconductor material contiguously extending from the front side surface 110$f$ to the back side surface 110$b$.

The semiconductor device 120 can be, for example, a field effect transistor, a bipolar transistor, a thyristor, a varactor, a diode, an electrical fuse, or any other type of semiconductor device known in the art.

The shield structure 140 may be a metal layer. In some embodiments, the shield structure 140 is made of copper. Embodiments of this disclosure are not limited thereto. The person having ordinary skill in the art can make proper modifications to the shield structure 140 depending on the actual application.

The TSV 130 and the shield structure 140 may be made of the same material. In some embodiments, the TSV 130 is made of copper. Embodiments of this disclosure are not limited thereto. The person having ordinary skill in the art can make proper modifications to the TSV 130 depending on the actual application.

The semiconductor structure 100 further includes a dielectric layer 150, at least one circuit layer 161, and at least one circuit layer 162. The dielectric layer 150 is disposed on the front side surface 110$f$. The circuit layer 161 is disposed in the dielectric layer 150, and the circuit layer 161 is electrically connected to the TSV 130. The circuit layer 162 is disposed in the dielectric layer 150, and the circuit layer 162 is electrically connected to the shield structure 140.

The semiconductor structure 100 further includes at least one pad 171 and at least one pad 172. The pad 171 is electrically connected to the circuit layer 161, and the pad 171 is used to be electrically connected to a signal terminal. The pad 172 is electrically connected to the circuit layer 162, and the pad 162 is used to be electrically connected to the power terminal or the ground terminal.

Therefore, the dielectric layer 150, the circuit layer 161, the circuit layer 162, the semiconductor device 120, the pad 171, and the pad 172 form a first redistribution layer.

Because the pad 171 will be electrically connected the signal terminal, and the pad 171 is electrically connected the circuit layer 161 and the semiconductor device 120, the signal from the signal terminal can be transformed into a different kind of signal by the semiconductor device 120, and then the transformed signal can pass the TSV 130.

The shield structure 140 may have a plurality of connecting portions 140$c$ electrically connecting the circuit layer 162. In this embodiment, the shield structure 140 has two connecting portions 140$c$ electrically connecting the circuit layer 162. Embodiments of this disclosure are not limited thereto. In some other embodiments, the shield structure 140 may have a connecting portion electrically connecting the circuit layer 162.

When the shield structure 140 has a plurality of connecting portions 140$c$ electrically connecting the circuit layer 162, the electrons in the shield structure 140 can enter and exit faster through different connecting portions 140$c$, such that the shielding effect can be performed more effectively by the shield structure 140.

The line pitch of the circuit layer 161 is less than 0.2 μm. Embodiments of this disclosure are not limited thereto. In some other embodiments, the person having ordinary skill in the art can make proper modifications to the circuit layer 161 depending on the actual application.

The semiconductor structure 100 further includes a dielectric layer 181 surrounding the TSV 130, and the dielectric layer 181 is disposed between the TSV 130 and the shield structure 140, such that the shield structure 140 is electrically isolated from the TSV 130.

Further, the substrate 110 is substantially absent between the TSV 130 and the shield structure 140.

The semiconductor structure 100 further includes a dielectric layer 182 surrounding the shield structure 140, and the dielectric layer 182 is disposed between the substrate 110 and the shield structure 140.

The dielectric layer 181 may be made of silicon oxide, silicon dioxide, and silicon oxynitride, and the dielectric layer 182 may be made of silicon oxide, silicon dioxide, and silicon oxynitride. Embodiments of this disclosure are not limited thereto. The person having ordinary skill in the art can make proper modifications to the material of the dielectric layer 181 and the dielectric layer 182 depending on the actual application.

In this embodiment, the shield structure 140 is covered by the back side surface 110b, and the height of the TSV 130 is greater than the height of the shield structure 140. Embodiments of this disclosure are not limited thereto.

Because the shield structure 140 is covered by the back side surface 110b, the situation that the shield structure 140 is accidentally electrically connected to some circuit outside the back side surface 110b can be prevented. Therefore, the voltage of the shield structure 140 will be more stable.

Figure 3:
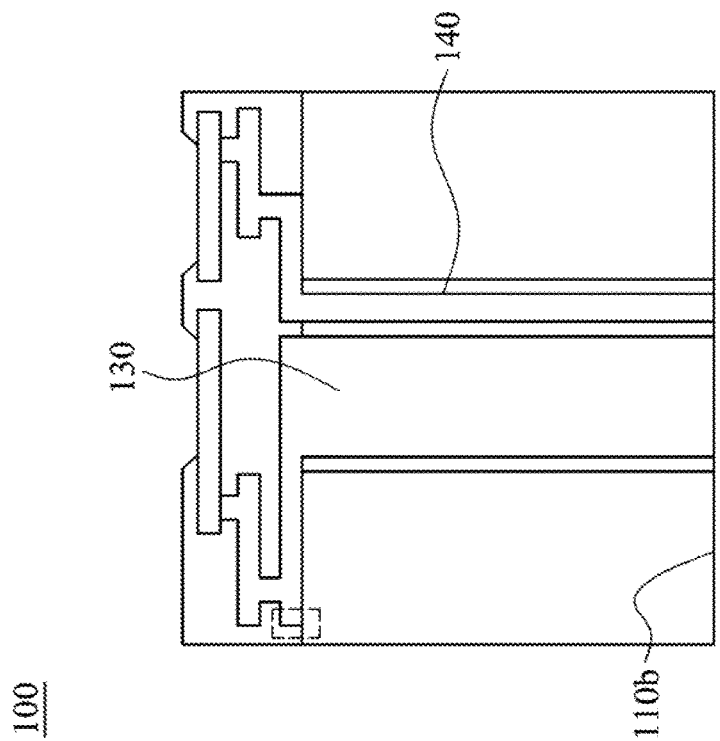
FIG. 3 is a schematic cross-sectional view of the semiconductor structure according to another embodiment of this disclosure.

FIG. 3 is a schematic cross-sectional view of the semiconductor structure 100 according to another embodiment of this disclosure. As shown in FIG. 3, the semiconductor structure 100 of this embodiment is similar to the semiconductor structure 100 of FIG. 1, and the main difference is that, in this embodiment, the shield structure 140 is exposed by the back side surface 110b. Therefore, the height of the TSV 130 approximately equals the height of the shield structure 140.

Figure 4:
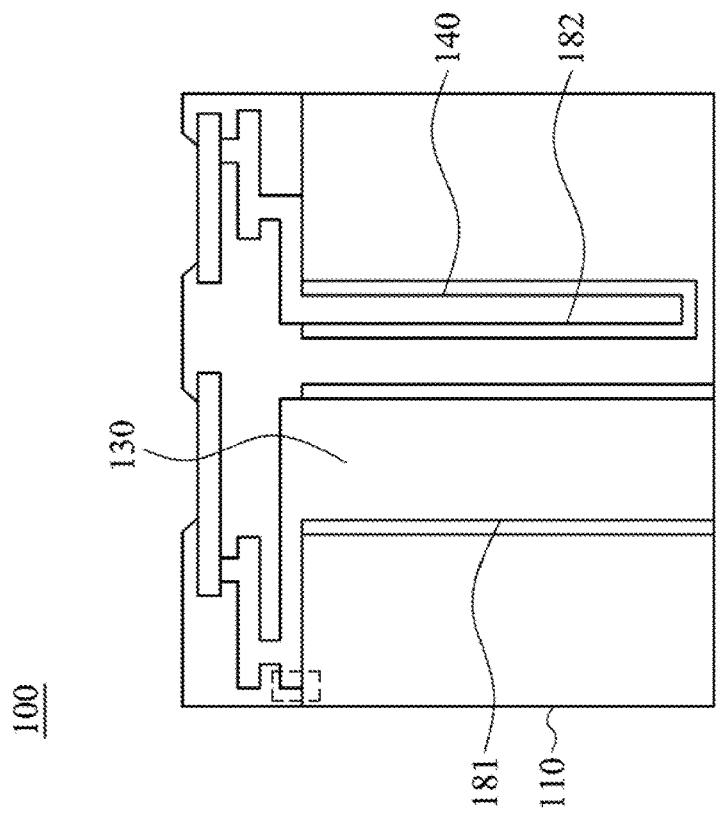
FIG. 4 is a schematic cross-sectional view of the semiconductor structure according to another embodiment of this disclosure.

FIG. 4 is a schematic cross-sectional view of the semiconductor structure 100 according to another embodiment of this disclosure. FIG. 5 is a schematic top view of the semiconductor structure 100 according to another embodiment of this disclosure. FIG. 4 is the cross-sectional view viewed along line 4-4 of FIG. 5. As shown in FIG. 4 and FIG. 5, the semiconductor structure 100 of this embodiment is similar to the semiconductor structure 100 of FIG. 1 and FIG. 2, and the main differences are described below.

The dielectric layer 182 is further disposed between the TSV 130 and the shield structure 140, and a part of the substrate 110 is disposed between the TSV 130 and the shield structure 140. Specifically, the part of the substrate 110 is disposed between the dielectric layer 181 and the part of the dielectric layer 182. The part of the dielectric layer 182 is disposed between the part of the substrate 110 and the shield structure 140.

FIG. 6 is a schematic cross-sectional view of the semiconductor structure 100 according to another embodiment of this disclosure. As shown in FIG. 6, the semiconductor structure 100 of this embodiment is similar to the semiconductor structure 100 of FIG. 4, and the main difference is that, in this embodiment, the shield structure 140 is exposed by the back side surface 110b. Therefore, the height of the TSV 130 approximately equals the height of the shield structure 140.

FIGS. 7 to 12 are schematic cross-sectional views of intermediate steps in processes for manufacturing the semiconductor structure 100 according to one embodiment of this disclosure. As shown in FIG. 7, a substrate 110 is provided. Then, at least one trench 110t1 is formed in the substrate 110. In some embodiments, the trench 110t1 is formed by etching. Then, a dielectric layer 181 is formed on the side surface and the bottom surface of the trench 110t1. Then, at least one TSV 130 is formed in the trench 110t1 and on the dielectric layer 181. In some embodiments, the TSV 130 is formed by plating.

As shown in FIG. 8, at least one trench 110t2 is formed in the substrate 110, and the trench 110t2 is formed adjacent to the TSV 130 and surrounds the TSV 130. Specifically, the trench 110t2 exposes the dielectric layer 181. In some embodiments, the trench 110t2 is formed by etching. Then, a dielectric layer 182 is formed on the side surface and the bottom surface of the trench 110t2. Then, a shield structure 140 is formed in the trench 110t2 and on the dielectric layer 182. In some embodiments, the shield structure 140 is formed by plating.

As shown in FIG. 9, at least one semiconductor device 120, at least one circuit layer 161, at least one circuit layer 162, at least one pad 171, at least one pad 172, and a dielectric layer 150 are respectively formed on the substrate 110, the TSV 130, and the shield structure 140. In other words, a first redistribution layer, which includes the dielectric layer 150, the circuit layer 161, the circuit layer 162, the semiconductor device 120, the pad 171, and the pad 172, is formed.

As shown in FIG. 10, at least one opening 150o1 and at least one opening 150o2 are respectively formed in the dielectric layer 150 to expose the pad 171 and the pad 172.

Figure 11:
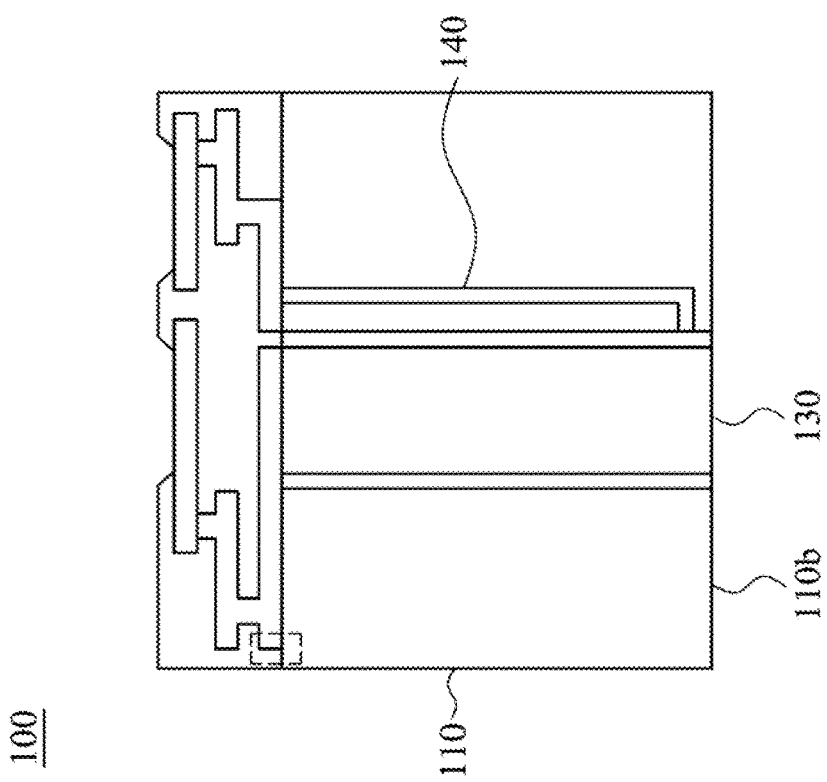

As shown in FIG. 11, the back side of the substrate 110 is grinded, such that the TSV 130 is exposed by the back side surface 110b. The semiconductor structure 100 may correspond to the semiconductor structure 100 of FIG. 1.

Figure 12:
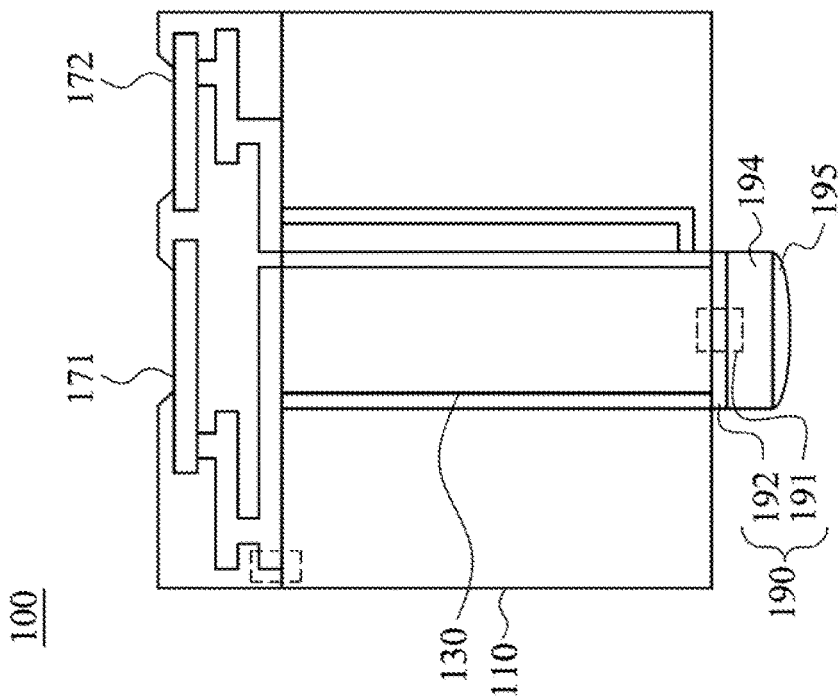

As shown in FIG. 12, at least one circuit layer 191, a dielectric layer 192, and at least one bump 194 are respectively formed on the TSV 130 exposed by the back side surface 110b and the back side surface 110b. The circuit layer 191 and the dielectric layer 192 form a second redistribution layer 193. In other words, the second redistribution layer 193 includes the circuit layer 191 and the dielectric layer 192. The second redistribution layer 193 is disposed on the back side surface 110b and the TSV 130 and electrically connected to the TSV 130. The bump 194 is disposed on a side of the second redistribution layer 193 opposite to the substrate 110.

Specifically, the circuit layer 191 is disposed in the dielectric layer 192 and electrically connected to the TSV 130, and the line pitch of the circuit layer 191 is greater than 1 μm. Embodiments of this disclosure are not limited thereto. The person having ordinary skill in the art can make proper modifications to the circuit layer 191 depending on the actual application.

In addition, at least one solder ball 195 may be formed on a side of the bump 194 opposite to the second redistribution layer 193.

The pad 171 and the pad 172 are used to be electrically connected to one chip, and the bump 194 or the solder ball 195 is used to be electrically connected to another chip.

As shown in FIG. 7 and FIG. 9, in some other embodiments, the semiconductor device 120 can be formed on the substrate 110 before the trench 110t1 is formed in the substrate 110.

As shown in FIG. 11, in some other embodiments, the back side of the substrate 110 may be grinded, such that the shield structure 140 is exposed by the back side surface 110b as well. Then, some other electrical connection structure, which is electrically isolated from the TSV 130, may be formed on the back side surface 110b to be electrical connected to the shield structure 140.

Figure 13:
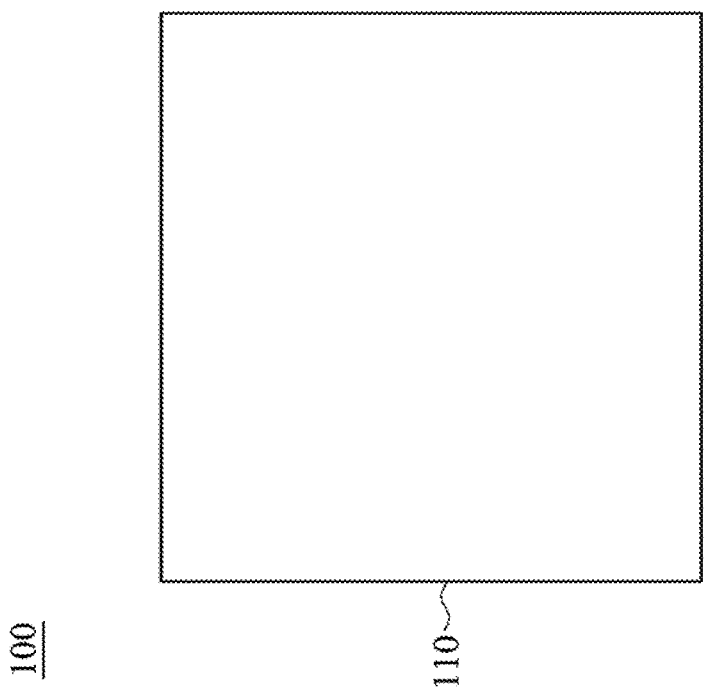

FIGS. 13 to 18 are schematic cross-sectional views of intermediate steps in processes for manufacturing the semiconductor structure 100 according to another embodiment of this disclosure. As shown in FIG. 13, a substrate 110 is provided.

Figure 14:
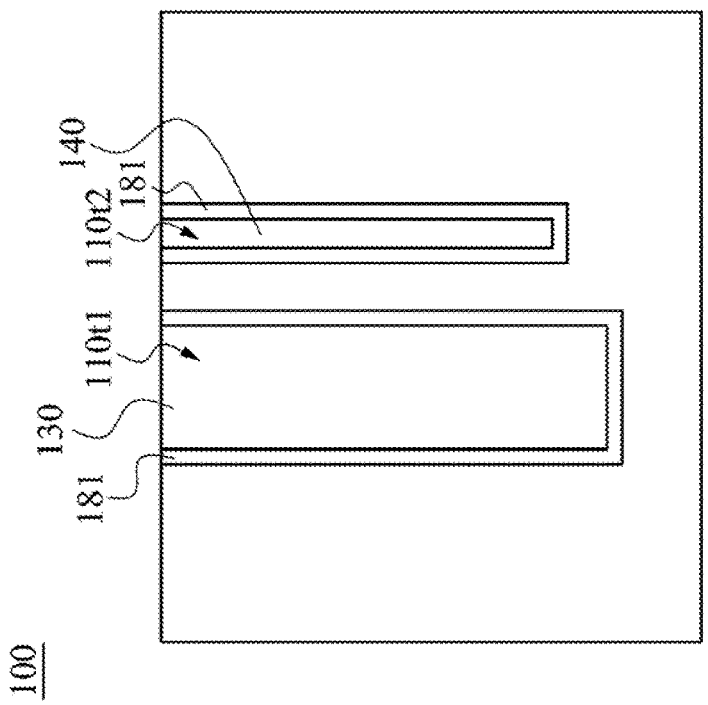

As shown in FIG. 14, at least one trench 110t1 and at least one trench 110t2 are formed in the substrate 110, and the trench 110t2 is formed adjacent to the trench 110t1 and surrounds the trench 110t1. In some embodiments, the trench 110t1 and the trench 110t2 are formed in one etching process (when the width of the trench is greater, the depth of the trench will automatically become smaller in the etching process). Then, a dielectric layer 181 is formed on the side surface and the bottom surface of the trench 110t1 and the side surface and the bottom surface of the trench 110t2. Then, at least one TSV 130 is formed in the trench 110t1 and on the dielectric layer 181. In some embodiments, the TSV 130 is formed by plating. Then, a shield structure 140 is formed in the trench 110t2 and on the dielectric layer 181. In some embodiments, the shield structure 140 is formed by plating.

Figures 15, 16:
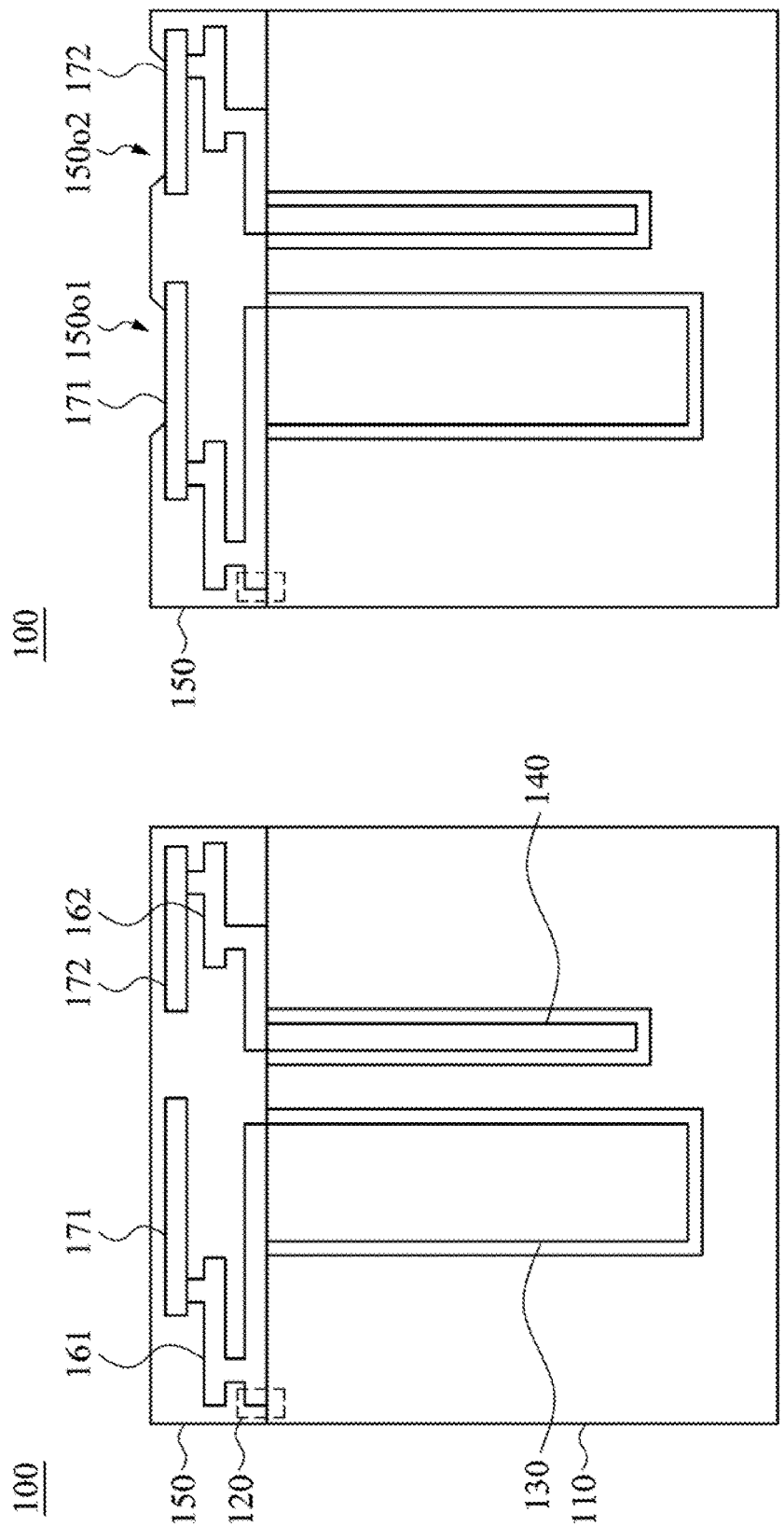

As shown in FIG. 15, at least one semiconductor device 120, at least one circuit layer 161, at least one circuit layer 162, at least one pad 171, at least one pad 172, and a dielectric layer 150 are respectively formed on the substrate 110, the TSV 130, and the shield structure 140. In other words, a first redistribution layer, which includes the dielectric layer 150, the circuit layer 161, the circuit layer 162, the semiconductor device 120, the pad 171, and the pad 172, is formed.

As shown in FIG. 16, at least one opening 15oo1 and at least one opening 150o2 are respectively formed in the dielectric layer 150 to expose the pad 171 and the pad 172.

As shown in FIG. 17, the back side of the substrate 110 is grinded, such that the TSV 130 is exposed by the back side surface 110b. The semiconductor structure 100 may correspond to the semiconductor structure 100 of FIG. 4.

As shown in FIG. 18, at least one circuit layer 191, a dielectric layer 192, and at least one bump 194 are respectively formed on the TSV 130 exposed by the back side surface 110b and the back side surface 110b. The circuit layer 191 and the dielectric layer 192 form the second redistribution layer 193. In other words, the second redistribution layer 193 includes the circuit layer 191 and the dielectric layer 192. The second redistribution layer 193 is disposed on the back side surface 110b and the TSV 130 and electrically connected to the TSV 130. The bump 194 is disposed on a side of the second redistribution layer 193 opposite to the substrate 110.

Specifically, the circuit layer 191 is disposed in the dielectric layer 192 and electrically connected to the TSV 130, and the line pitch of the circuit layer 191 is greater than 1 µm. Embodiments of this disclosure are not limited thereto. The person having ordinary skill in the art can make proper modifications to the circuit layer 191 depending on the actual application.

In addition, at least one solder ball 195 may be formed on a side of the bump 194 opposite to the second redistribution layer 193.

As shown in FIG. 14, and FIG. 15, in some other embodiments, the semiconductor device 120 can be formed on the substrate 110 before the trench 110t1 is formed in the substrate 110.

As shown in FIG. 17, in some other embodiments, the back side of the substrate 110 may be grinded, such that the shield structure 140 is exposed by the back side surface 110b as well. Then, some other electrical connection structure, which is electrically isolated from the TSV 130, may be formed on the back side surface 110b to be electrical connected to the shield structure 140.

Because the distances between the TSVs 130 are not very large, some crosstalk between the currents in the TSVs 130 may happen. In order to prevent the crosstalk between the currents in the TSVs 130, the shield structure 140 surrounds the TSV 130, such that the shielding effect will protect the currents in the TSVs 130 from being influenced by the electric fields and the magnetic fields generated by other currents in the TSVs 130.

Further, because the shield structure 140 will be electrically connected a power terminal or a ground terminal, the voltage of the shield structure 140 can maintain unchanged (in most case, the voltage will be zero). Therefore, the shield structure 140 can effectively perform the shielding effect.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C. § 112, 6th paragraph. In particular, the use of "step of" in the claims herein is not intended to invoke the provisions of 35 U.S.C. § 112, 6th paragraph.

What is claimed is:

1. A semiconductor structure, comprising:
   a substrate having a front side surface and a back side surface;
   at least one semiconductor device disposed on the front side surface;
   a through-substrate via (TSV) disposed in the substrate, wherein the TSV is exposed by the front side surface and the back side surface, and the TSV is electrically connected to the semiconductor device;
   a shield structure disposed in the substrate and surrounding the TSV, wherein the shield structure is exposed by the front side surface, the shield structure is electrically isolated from the TSV, and the shield structure and the TSV having bottom ends at different heights; and
   a first dielectric layer covering a side surface and a bottom surface of the shield structure, wherein the back side surface of the substrate is lower than a bottom surface of the first dielectric layer.

2. The semiconductor structure of claim 1, further comprising:
   a second dielectric layer disposed on the front side surface;
   a first circuit layer disposed in the second dielectric layer, wherein the first circuit layer is electrically connected to the TSV; and
   a second circuit layer disposed in the second dielectric layer, wherein the second circuit layer is electrically connected to the shield structure.

3. The semiconductor structure of claim 2, further comprising:
   a first pad electrically connected to the first circuit layer; and
   a second pad electrically connected to the second circuit layer.

4. The semiconductor structure of claim 2, wherein the second dielectric layer, the first circuit layer, the second circuit layer, and the semiconductor device form a first redistribution layer.

5. The semiconductor structure of claim 2, wherein the shield structure has a connecting portion electrically connecting the second circuit layer.

6. The semiconductor structure of claim 1, wherein the shield structure is covered by the back side surface.

7. The semiconductor structure of claim 1, wherein a height of the TSV is greater than a height of the shield structure.

8. The semiconductor structure of claim 1, wherein the shield structure is a metal layer.

9. The semiconductor structure of claim 1, further comprising:
a second redistribution layer disposed on the back side surface and electrically connected to the TSV.

10. The semiconductor structure of claim 9, further comprising:
a bump disposed on a side of the second redistribution layer opposite to the substrate.

11. The semiconductor structure of claim 9, wherein the second redistribution layer comprises:
a third dielectric layer; and
a third circuit layer disposed in the third dielectric layer and electrically connected to the TSV.

12. The semiconductor structure of claim 1, wherein the substrate is substantially absent between the TSV and the shield structure.

13. The semiconductor structure of claim 1, wherein a part of the substrate is disposed between the TSV and the shield structure.

14. The semiconductor structure of claim 1, wherein the TSV is made of copper.

15. The semiconductor structure of claim 1, wherein the TSV and the shield structure are made of a same material.

* * * * *